(12) United States Patent
Shirasaki

(10) Patent No.: US 10,136,517 B2
(45) Date of Patent: Nov. 20, 2018

(54) ELECTRONIC COMPONENT MOUNTING PACKAGE AND ELECTRONIC DEVICE

(71) Applicant: KYOCERA Corporation, Kyoto-shi, Kyoto (JP)

(72) Inventor: Takayuki Shirasaki, Omihachiman (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 15/754,670

(22) PCT Filed: Nov. 24, 2016

(86) PCT No.: PCT/JP2016/084731
§ 371 (c)(1),
(2) Date: Feb. 23, 2018

(87) PCT Pub. No.: WO2017/090651
PCT Pub. Date: Jun. 1, 2017

(65) Prior Publication Data
US 2018/0255641 A1 Sep. 6, 2018

(30) Foreign Application Priority Data
Nov. 27, 2015 (JP) .................................. 2015-231706

(51) Int. Cl.
| G02F 1/035 | (2006.01) |
| G02F 1/225 | (2006.01) |
| H05K 1/18 | (2006.01) |
| G02F 1/03 | (2006.01) |

(52) U.S. Cl.
CPC ............. *H05K 1/181* (2013.01); *G02F 1/035* (2013.01); *G02F 1/0327* (2013.01)

(58) Field of Classification Search
CPC ........ H05K 1/181; G02F 1/0327; G02F 1/035
See application file for complete search history.

(56) References Cited

U.S. PATENT DOCUMENTS

| 5,739,463 A * | 4/1998 | Diaz ................... H05K 5/0039 |
| | | 174/378 |
| 2002/0094705 A1* | 7/2002 | Driscoll ............... H01R 23/688 |
| | | 439/65 |
| 2012/0051683 A1 | 3/2012 | Sugiyama |
(Continued)

FOREIGN PATENT DOCUMENTS

| JP | 2012-048121 A | 3/2012 |
| JP | 2017-067981 A | 4/2017 |

*Primary Examiner* — Hoa C Nguyen
(74) *Attorney, Agent, or Firm* — Volpe and Koenig, P.C.

(57) ABSTRACT

An electronic component mounting package includes a body portion which accommodates an electronic component; a flexible substrate. The body portion comprises a notched portion which is open to a lower surface and a side surface thereof, and is provided with a projecting ridge portion which extends along a side end portion of the notched portion on a side surface side of the notched body portion. The flexible substrate extends from an interior of the notched portion to an exterior of the notched portion, and comprises a fixed end portion joined to a terminal of a coaxial connector disposed on a bottom surface of the notched portion, and a free end portion extending to the exterior of the notched portion. The flexible substrate abuts on the projecting ridge portion to be bent.

4 Claims, 5 Drawing Sheets

(56) References Cited

U.S. PATENT DOCUMENTS

| | | | |
|---|---|---|---|
| 2013/0257659 A1* | 10/2013 | Darnell | H01Q 1/243 343/702 |
| 2015/0261063 A1* | 9/2015 | Sugiyama | G02F 1/225 382/2 |
| 2016/0006210 A1* | 1/2016 | Noguchi | H01L 31/0203 438/26 |
| 2017/0255032 A1* | 9/2017 | Kataoka | G02F 1/03 |

* cited by examiner

ELECTRONIC COMPONENT MOUNTING PACKAGE AND ELECTRONIC DEVICE

TECHNICAL FIELD

The present invention relates to an electronic element mounting package for accommodating an electronic component operated in a high-frequency band, and an electronic device using the same.

BACKGROUND ART

In recent years, a demand for high-speed communication is abruptly increased, and research and development relating to high-speed large capacity information transfer are in progress. Among others, speeding-up of the electronic devices such as semiconductor devices which receive and transmit an optical signal by using an optical communication apparatus has received widespread attention. In other words, souping-up and speeding-up of the optical signal by the electronic device have been researched and developed as a subject for improving a transmission capacity.

Examples of the electronic component mounting package for the electronic device as described above include a configuration including, for example, a housing which accommodates an electronic component, a flexible substrate connected to a side wall of the housing and a lead pin which electrically connects the electronic component and the flexible substrate.

CITATION LIST

Patent Literature

Patent Literature 1: Japanese Unexamined Patent Publication JP-A 2012-48121

SUMMARY OF INVENTION

According to an aspect of the invention, an electronic component mounting package includes: a housing including a body portion having an upper surface provided with a concave portion, a lower surface provided with a notched portion, and a through hole extending from a bottom surface of the concave portion to a bottom surface of the notched portion, and a projecting ridge portion disposed on the bottom surface of the notched portion so as to extend along an end portion of a notched side surface of the body portion; a coaxial connector disposed on the notched portion; and a flexible substrate extending from an interior of the notched portion to an exterior of the notched portion. The coaxial connector includes a terminal having an upper end projecting through the through hole into an interior of the concave portion and a lower end projecting into an interior of the notched portion. The flexible substrate includes a fixed end portion joined to the lower end of the terminal and a free end portion on an opposite side to a fixed end portion side. The flexible substrate abuts on the projecting ridge portion to be bent.

According to another aspect of the invention, an electronic device includes the electronic component mounting package having the configuration mentioned above, an electronic component accommodated in the concave portion of the electronic component mounting package, and a lid body joined to the electronic component mounting package.

DESCRIPTION OF EMBODIMENTS

Figure 1:
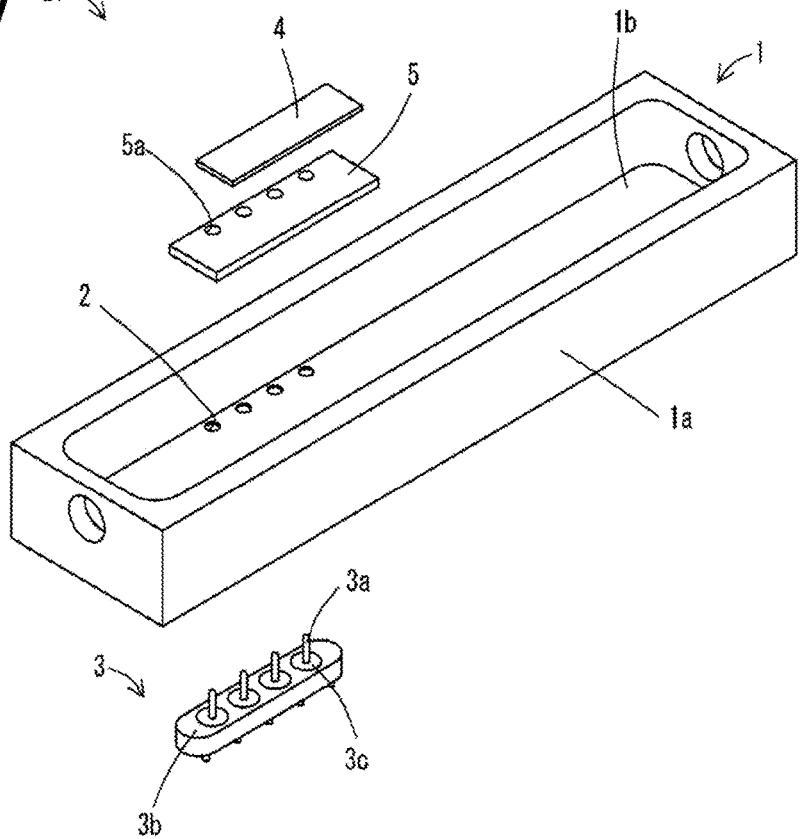
FIG. 1 is an exploded perspective view illustrating an electronic component mounting package according to a first embodiment of the invention.
Figure 2:
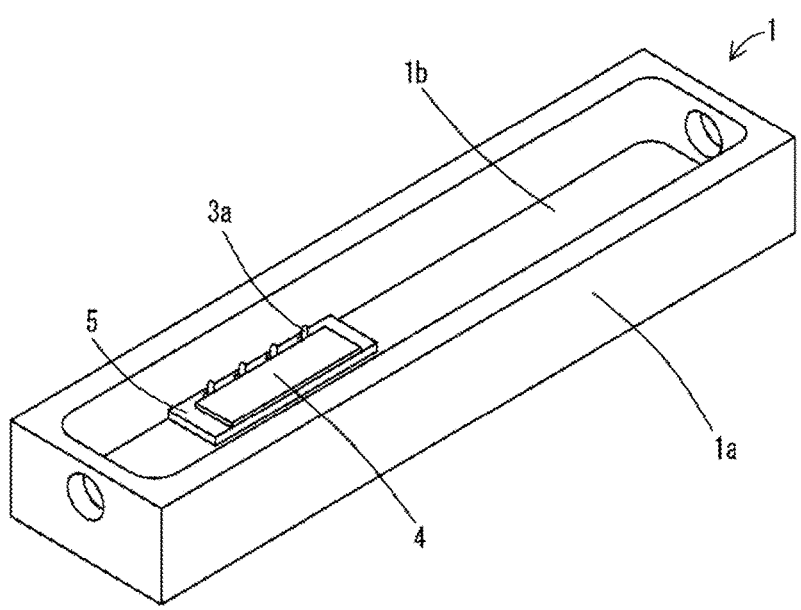
FIG. 2 is a perspective view illustrating an electronic component mounting package according to the first embodiment of the invention.
Figure 3:
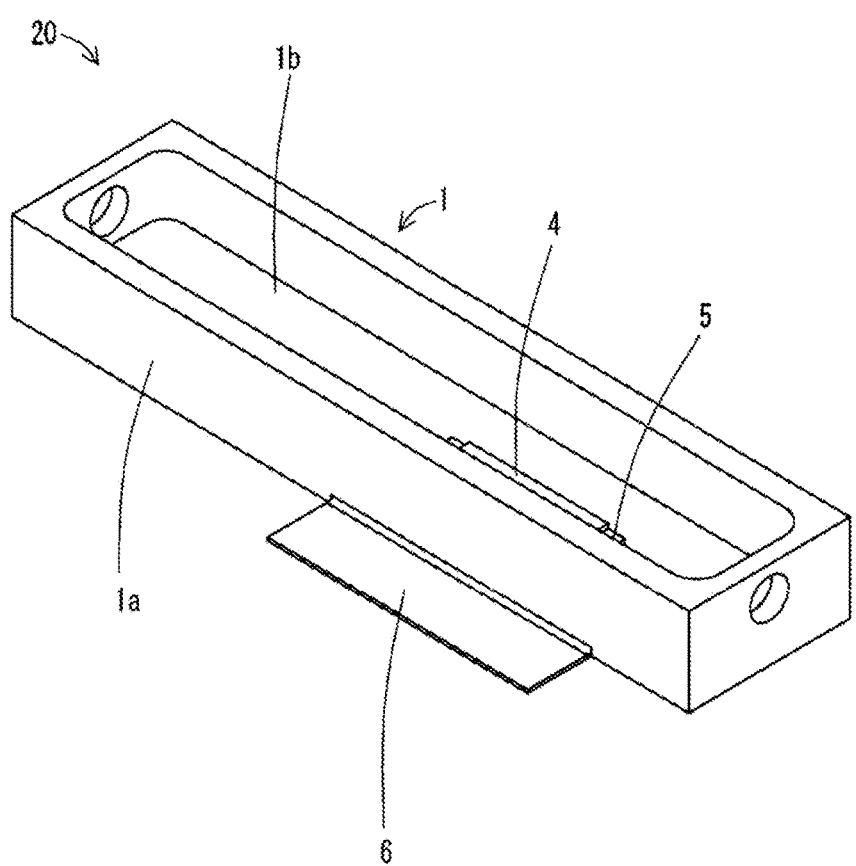
FIG. 3 is a perspective view illustrating an electronic component mounting package according to the first embodiment of the invention.
Figure 4:
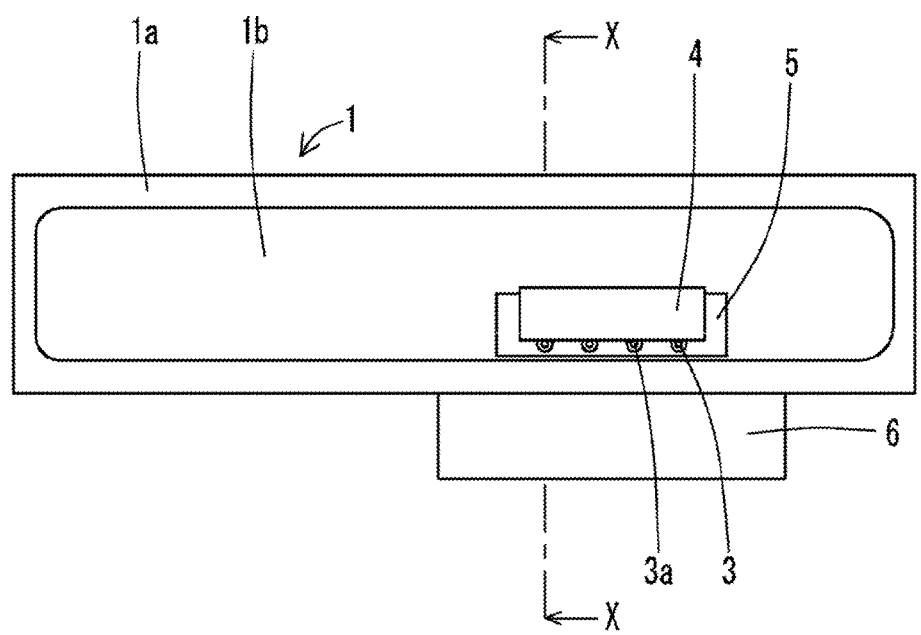
FIG. 4 is a plan view illustrating an electronic component mounting package according to the first embodiment of the invention.

Referring now to drawings, exemplary embodiments of the invention will be described.

An electronic component mounting package 20 according to a first embodiment of the invention will be described with reference to FIG. 1 to FIG. 5.

The electronic component mounting package 20 of this embodiment includes a housing 1, a coaxial connector 3, and a flexible substrate 6.

The housing 1 includes a body portion 1a including an upper surface provided with a concave portion 1b for accommodating an electronic component and a lower surface provided with a notched portion 1c. The notched portion 1c opens on the lower surface and a side surface of the housing 1. The body portion 1a is provided with a through hole 2 extending from a bottom surface of the concave portion 1b to a bottom surface of the notched portion 1c. The bottom surface of the notched portion 1c refers to an inner surface of the notched portion 1c on an upper surface side closer to the concave portion 1b.

The body portion 1a functions as an accommodating member for accommodating the electronic component. In addition, the body portion 1a has a function of performing electromagnetic shielding with the outside of the electronic component mounting package 20. The body portion 1a is formed of a metallic material such as a stainless steel including Fe—Ni—Cr alloy (SUS304, SUS310, etc. of JIS standard) or Fe—Ni—Cr—Mo alloy (SUS303, SUS316, etc. of JIS standard), Fe—Ni—Co alloy, or Cu—Zn alloy.

For example, when an electronic component to be accommodated in the concave portion 1b of the body portion 1a is a modulation element formed of LN (lithium niobate), which is a ferroelectric element (hereinafter, referred to as LN element), the body portion 1a is manufactured by using a metallic material having coefficients of thermal expansion approximate to a coefficient of thermal expansion $15.4 \times 10^{-6}/°$ C. of the LN element including Fe—Ni—Cr alloy or Fe—Ni—Cr—Mo alloy such as SUS303 (coefficient of thermal expansion: $14.6 \times 10^{-6}/°$ C.), SUS304 (coefficient of thermal expansion: $17.3 \times 10^{-6}/°$ C.), SUS310 (coefficient of thermal expansion: 15.8×10$^{-6}$/° C.), SUS316 (coefficient of thermal expansion: 16.0×10$^{-6}$/° C.).

In this case, when the electronic device is manufactured by accommodating the LN element in the concave portion 1b of the body portion 1a, coefficients of thermal expansion of the body portion 1a and the electronic component are approximate to each other. Therefore, a stress caused by a difference in coefficient of thermal expansion alleviates a probability of separation of an electronic component 11 from the body portion 1a. This stress is caused, for example, by heat generated when the electronic component is operated, heat applied when mounting the electronic component 11 on the body portion 1a via a brazing material, and heat applied in an environment test and a reliability test of the electronic device.

In addition, the body portion 1a is manufactured by applying a metal machining process known in the related art such as rolling, and punching on an ingot of the metallic material described above to obtain a base body and a frame body, and joining the base body and the frame body. A surface of the body portion 1a may be covered with a metal superior in corrosion resistance and superior in wetness with respect to the brazing material. Specifically, the surface of the body portion 1a is covered in sequence with a Ni layer having a thickness 0.5 to 9 µm and an Au layer having a thickness of 0.5 to 9 µm. In this case, it is possible to reduce the probability of oxidation corrosion of the body portion 1a. In addition, a base 5 for placing a circuit substrate 4 on a bottom surface of the concave portion 1b of the body portion 1a may be firmly adhered and fixed.

The base body and the frame body may be formed integrally with each other. A method of this integral formation includes a method of applying metal machining such as cutting and electrospark machining on an ingot formed of a metallic material such as Fe—Ni—Cr alloy and Fe—Ni—Cr—Mo alloy described above. In this method, the body portion 1a may be formed into a predetermined shape. In the case where the base body and the frame body are formed integrally with each other, it is possible to reduce a probability of joint misalignment which may occur at the time of assembly.

Figure 5:
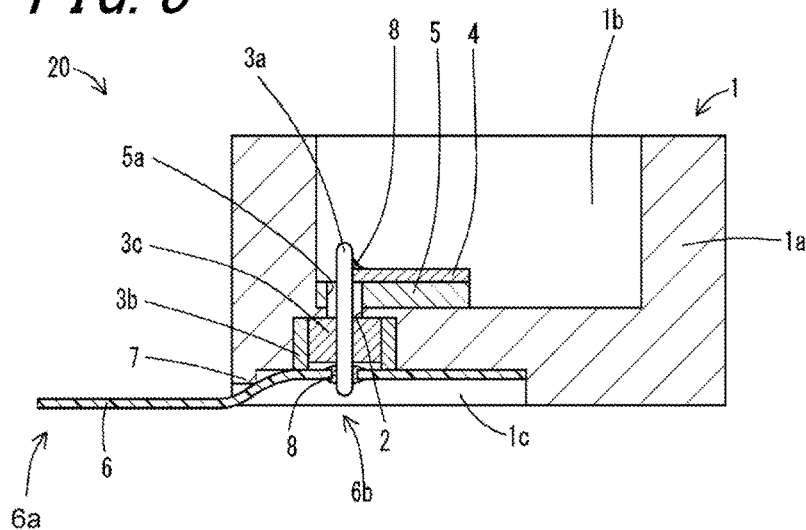
FIG. 5 is a cross-sectional view taken along the line X-X in FIG. 4.

The body portion 1a includes the through hole 2 extending from the bottom surface of the concave portion 1b to the bottom surface of the notched portion 1c. One or more through holes 2 exist. The through hole 2 may be formed to have an opening area on the bottom surface side of the notched portion 1c larger than an opening area on the bottom surface side of the concave portion 1b. For example, when the through hole 2 has a circular shape, the through hole 2 may have a shape connecting a column having a smaller diameter on a side of the bottom surface of the concave portion 1b and a column having a larger diameter opening in the notched portion 1c located below, as illustrated in FIG. 5. Accordingly, when the coaxial connector 3 is inserted into and fixed to the through hole 2, it is possible to utilize a step formed at a position of diameter difference. Therefore, it is possible to reduce positional displacement of the coaxial connector 3 toward the concave portion 1b.

A projecting ridge portion 7 is provided on the bottom surface of the notched portion 1c. The projecting ridge portion 7 extends along an end portion of a notched side surface of the body portion 1a. The projecting ridge portion 7 may be formed of a material different from that of the body portion 1a or may be formed of a member separate from the body portion 1a. The projecting ridge portion 7 may be formed integrally with the body portion 1a by using a metallic material which is similar to that of the body portion 1a. When the projecting ridge portion 7 is formed integrally with the body portion 1a, the notched portion 1c and the projecting ridge portion 7 are formed on a lower surface of the base body by performing cutting of the lower surface of the base body.

The coaxial connector 3 includes a terminal 3a, a retaining member 3b having a hole in which the terminal 3a is inserted therethrough, and a sealing member 3c. The coaxial connector 3 may have a plurality of the terminals 3a. When the coaxial connector 3 includes the plurality of terminals 3a, the plurality of terminals 3a may be used as signal terminals, and may be used for inputting and outputting a plurality of high-frequency signals with respect to an electronic device 30.

The terminal 3a is formed of a metal such as Fe—Ni—Co alloy or Fe—Ni alloy. When the terminal 3a is formed of Fe—Ni—Co alloy, metallic machining such as rolling or punching is applied to an ingot (mass) of the alloy. As a result of such machining, a linear terminal 3a having a length of 1.5 to 22 mm and a diameter of 0.1 to 0.5 mm is manufactured.

When the diameter of the terminal 3a is smaller than 0.1 mm, the terminal 3a is susceptible to bending, so that unintentional bending of the terminal 3a may result even with slight carelessness in handling. Once the terminal 3a is bent, when an air-coaxial portion is provided, impedance at this point (a characteristic impedance, the same applies to impedances from this onward) is susceptible to be unexpectedly deviated. In addition, workability of connection between the terminal 3a and an external circuit may be reduced. When the diameter of the terminal 3a exceeds 0.5 mm, diameters of the through hole 2 and an insertion hole 5a required for impedance matching are increased unnecessarily, and downsizing of the electronic device becomes difficult. Therefore, the diameter of the terminal 3a is, for example, set to 0.1 to 0.5 mm.

The retaining member 3b is formed of a metallic material which is similar to that of the body portion 1a. The method of machining the metallic material is the same as the body portion 1a. In this case, this embodiment also includes a structure in which the body portion 1a further includes the retaining member 3b and the retaining member 3b is interposed between the through hole 2 and the sealing member 3c as part of the body portion 1a. In the case illustrated in FIG. 1 to FIG. 5, the retaining member 3b is brazed on an inner peripheral surface of the through hole 2 provided in the body portion 1a. In addition, as illustrated in FIG. 5, when the through hole 2 has the shape connecting the column having the smaller diameter on the side of the bottom surface of the concave portion 1b and the column having the larger diameter opening in the notched portion 1c located below, the retaining member 3b may be brazed to the inner peripheral surface of the through hole 2 having the larger diameter opening in the notched portion 1c. The terminal 3a is inserted into the retaining member 3b, and is fixed to the retaining member 3b via the sealing member 3c.

The sealing member 3c is formed of an insulating inorganic material such as glass and ceramics. The sealing member 3c ensures insulation properties between the terminal 3a and the housing 1 or between the terminal 3a and the retaining member 3b.

Examples of the coefficient of the sealing member 3c described above include a glass such as borosilicate glass or soda glass, and a material in which ceramic filler for adjusting a coefficient of thermal expansion and a relative permittivity of the sealing member 3c is added to such glass. A filler is used for the sealing member 3c with the relative permittivity thereof adjusted as needed for impedance matching. Examples of the filler for reducing the relative permittivity include lithium oxide. For example, the following conditions may be set to achieve a characteristic impedance of 50 Ω. In other words, in a case where the inner diameter of the through hole 2 is 1.75 mm and the outer diameter of the terminal 3a is 0.2 mm, a sealing member 3c having a relative permittivity of 6.8 may be selected. In addition, in a case where the inner diameter of the through hole 2 is 1.65 mm and the outer diameter of the terminal 3a is 0.25 mm, a sealing member 3c having a relative permittivity of 5 may be selected.

The flexible substrate 6 extends from the interior of the notched portion 1c beyond the projecting ridge portion 7 to the exterior of the notched portion 1c. The flexible substrate 6 includes a fixed end portion 6b joined to the lower end of the terminal 3a via a joint member 8 and a free end portion 6a on the opposite side to the fixed end portion. The fixed end portion 6b corresponds to a proximal end in the above-described direction of extension and the free end portion 6a corresponds to a distal end in the direction of extension. The flexible substrate 6 abuts on the projecting ridge portion 7 to be bent so that the free end portion 6a extends obliquely downward. Accordingly, the free end portion 6a is located at a position lower than the fixed end portion 6b. The terminal 3a is inserted into a penetrating portion provided in the flexible substrate 6 and joined and fixed thereto with the joint member 8. Although not illustrated, the flexible substrate 6 includes a wiring conductor which is electrically connected to the terminal 3a via the joint member 8 and is provided around the penetrating portion described above, and a grounding wiring conductor which is electrically connected to the retaining member 3b via the conductive member.

As illustrated in FIG. 5, the flexible substrate 6 is disposed so that a surface opposing the bottom surface of the notched portion 1c abuts on an end surface of the retaining member 3b on the notched portion 1c side and the bottom surface of the notched portion 1c, and is fixed to the coaxial connector 3. Accordingly, it is possible to reduce a probability of positional displacement of the flexible substrate 6 with respect to the coaxial connector 3 due to deformation or the like, and thus to maintain desired frequency characteristics of the flexible substrate 6. Also, the flexible substrate 6 may be disposed so that an end portion thereof on the opposite side to the free end portion 6a abuts on the side surface of the notched portion 1c on the opposite side to the projecting ridge portion and be fixed to the coaxial connector 3, whereby desired frequency characteristics may be maintained by the similar advantageous effects to those described above.

In this configuration, a stress on the principle of lever is hard to be generated at the fixed end portion 6b even when a force in a vertical direction is applied to the free end portion 6a of the flexible substrate 6 in a case where the flexible substrate 6 and an external circuit substrate 14 are connected. In addition, a force applied to the fixed end portion 6b may be alleviated even when a force is applied in a pulling direction. It is also possible to reduce a probability of displacement of the flexible substrate 6 from the desired position. In other words, even when a force is applied to the free end portion 6a, the fixed end portion 6b is protected from being easily broken, and desired frequency characteristics may be maintained. Therefore, when the flexible substrate 6 and the external circuit substrate 14 are connected, reliability of connection between the electronic component mounting package 20 and the external circuit substrate 14 may be improved.

Figure 6:
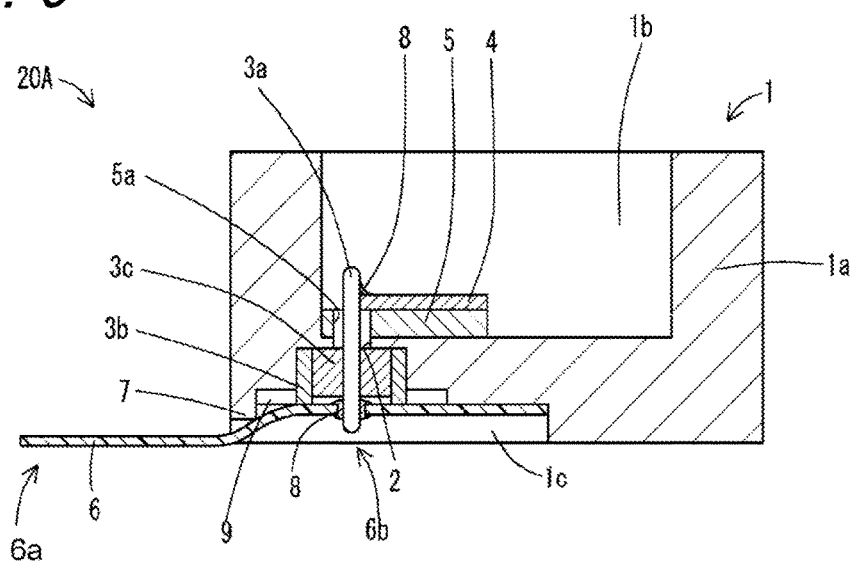
FIG. 6 is a cross-sectional view illustrating an electronic component mounting package according to a second embodiment of the invention.

FIG. 6 illustrates an electronic component mounting package 20A according to a second embodiment of the invention. The through hole 2 is provided so as to have an opening area on the bottom surface side of the notched portion 1c larger than an opening area on the bottom surface side of the concave portion 1b. The coaxial connector 3 includes the retaining member 3b having a hole in which the terminal 3a is inserted. The retaining member 3b is accommodated in the through hole 2. A groove 9 extending along the projecting ridge portion 7 is formed in an area between the projecting ridge portion 7 and the coaxial connector 3 of the bottom surface of the notched portion 1c. The groove 9 communicates with the through hole 2. Accordingly, it is possible to reduce a probability of generation of high-frequency resonance between the retaining member 3b accommodated in the through hole 2 and the projecting ridge portion 7. As illustrated in FIG. 6, the groove 9 may be part of an annular groove formed so as to surround the through hole 2 and the retaining member 3b. In other words, the groove 9 may be formed in an area between the projecting ridge portion 7 on the bottom surface of the notched portion 1c and the side surface of the notched portion 1c on the opposite side to the projecting ridge portion 7. Accordingly, it is possible to reduce a probability of generation of high-frequency resonance between the retaining member 3b accommodated in the through hole 2 and the projecting ridge portion 7 and between the projecting ridge portion 7 and the side surface of the notched portion 1c on the opposite side to the projecting ridge portion 7.

Figure 7:
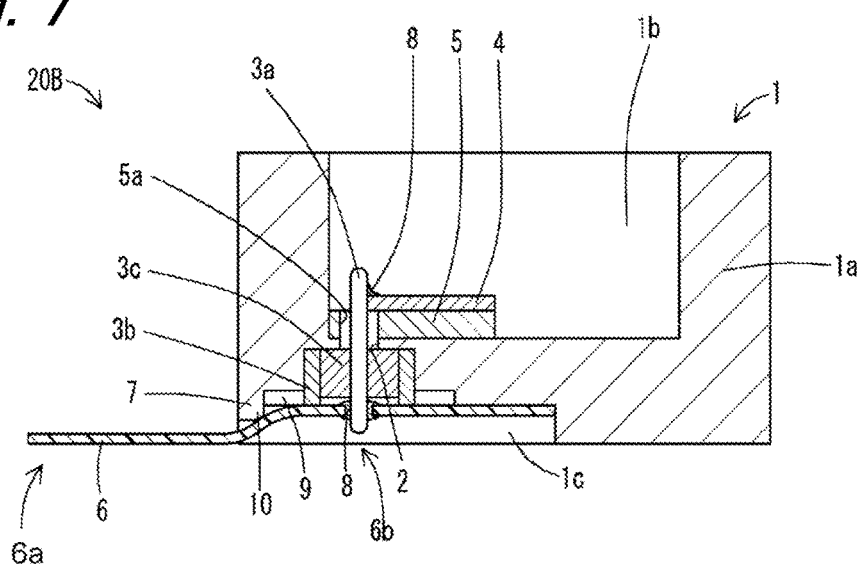
FIG. 7 is a cross-sectional view illustrating an electronic component mounting package according to a third embodiment of the invention.

FIG. 7 illustrates an electronic component mounting package 20B according to a third embodiment of the invention. In the electronic component mounting package 20B according to the third embodiment of the invention, the projecting ridge portion 7 has a rectangular parallelepiped shape having a chamfered portion 10 at an inner corner facing the coaxial connector 3. The chamfered portion 10 abuts on the flexible substrate 6. In this configuration, it is possible to reduce a probability of damage of a portion of the flexible substrate 6 which abuts on the projecting ridge portion 7.

The chamfered portion 10, for example, may be smaller in width in a horizontal direction than a height in the vertical direction. Accordingly, bending of the flexible substrate 6 caused by abutting on the projecting ridge portion 7 may be alleviated. A stress applied to the fixed end portion 6b by bending of the flexible substrate 6 and a stress applied to a bending portion of the flexible substrate 6 are reduced. Therefore, it is possible to reduce a probability of damage of the fixed end portion 6b and the flexible substrate 6, and to reduce probabilities of displacement from the desired position and deformation of the flexible substrate 6. In addition, the chamfered portion 10 may have a convex curved shape. Accordingly, it is possible to reduce a surface area where the chamfered portion 10 abuts on the flexible substrate 6. Accordingly, it is possible to reduce a probability of damage of the flexible substrate 6.

Figure 8:
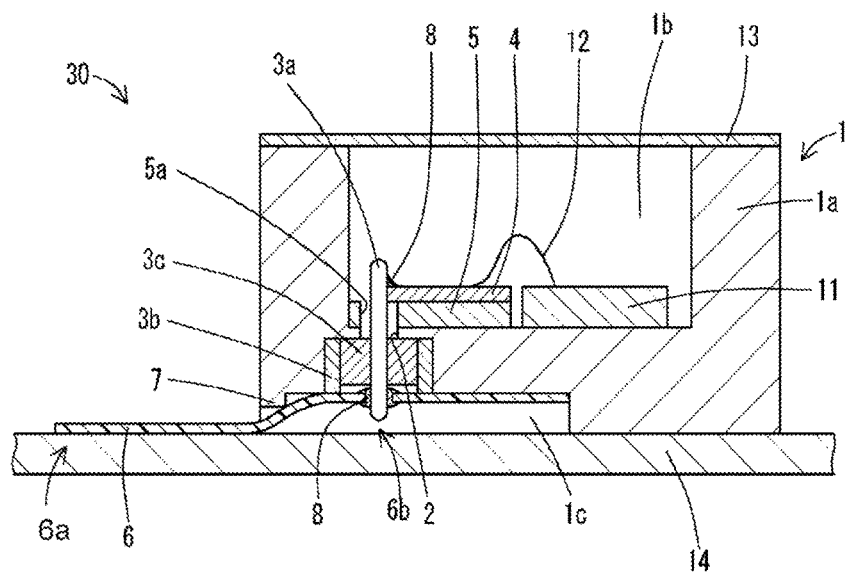
FIG. 8 is a cross-sectional view illustrating an electronic device of the invention.

FIG. 8 is a cross-sectional view of an electronic device 30 according to the embodiment of the invention. The electronic device 30 includes the electronic component mounting package 20, 20A, 20B having the configuration described above, the electronic component 11 accommodated in the concave portion 1b of the electronic component mounting package 20, 20A, 20B, and a lid body 13 joined to the electronic component mounting package 20, 20A, 20B so as to cover the electronic component 11.

In this configuration, a stress on the principle of lever is hard to be generated at the fixed end portion 6b even when a force is applied to the free end portion 6a of the flexible substrate 6 in a case where the electronic device 30 and the external circuit substrate 14 are connected. It is also possible to reduce a probability of displacement of the flexible substrate 6 from the desired position. Therefore, it is possible to reduce a probability of damage of the fixed end portion 6b, and to maintain desired frequency characteristics. Therefore, the free end portion 6a of the flexible substrate 6 is not susceptible to be easily broken even when a force is applied thereto to connect the electronic device 30 to the external circuit substrate 14, and it is possible to reduce a probability of variations of the frequency characteristics. Consequently, it is possible to improve reliability of connection between the electronic device 30 and the external circuit substrate 14 and to realize stable frequency characteristics.

The lower surface of the body portion 1a is provided with the notched portion 1c, and at least part of the flexible substrate 6 is accommodated in the notched portion 1c. Therefore, when a flat portion of the lower surface of the body portion 1a where the notched portion 1c is not provided and the external circuit substrate 14 are mounted in contact with each other, a fixed portion between the coaxial connector 3 and the flexible substrate 6 is accommodated in the notched portion 1c, so that the electronic component mounting package 20, 20A, 20B may easily be reduced in height. The flexible substrate 6 and the terminal 3a are not interposed between the flat portion of the lower surface of the body portion 1a where the notched portion 1c is not provided and the external circuit substrate 14. Therefore, the electronic device 30 is hard to be inclined, and is stably mounted on the external circuit substrate 14. Therefore, improved heat discharging properties and mounting reliability are achieved, and the frequency characteristics of the electronic component mounting package 20, 20A, 20B may be stably maintained.

In this case, the free end portion 6a as part of the flexible substrate 6 provided outside the notched portion 1c may be located below the flat portion of the lower surface of the housing 1 where the notched portion 1c is not provided. The part comes into contact with the external circuit substrate 14 under a certain pressure at the time of mounting. Therefore, a joint work between the wiring conductor provided on the flexible substrate 6 and the external circuit substrate 14 via a brazing material such as solder may be facilitated. The free end portion 6a as part of the flexible substrate 6 provided outside the notched portion 1c may be located above the flat portion of the lower surface of the housing 1 where the notched portion 1c is not provided. Accordingly, when mounting the electronic device 30 on the external circuit substrate 14, the electronic component mounting package 20, 20A, 20B of the invention may be provided with a clearance gap between the free end portion 6a and the external circuit substrate 14. Therefore, when the electronic device 30 is mounted on the external circuit substrate 14, the free end portion 6a abuts on the external circuit substrate 14, and the electronic device 30 is hard to be inclined. Consequently, the electronic component mounting packages 20, 20A, 20B of the invention can maintain the heat discharging properties via the lower surface of the housing 1.

The base 5 and the electronic component 11 are joined to the bottom surface of the concave portion 1b of the body portion 1a. The circuit substrate 4 having a conductor line (not illustrated) is placed on and joined to an upper surface of the base 5.

The circuit substrate 4 is formed of ceramics such as alumina ($Al_2O_3$) ceramics or aluminum nitride (AlN) ceramics insulating substrate. The circuit substrate 4 functions as a substrate for impedance matching. The alumina ceramics insulating substrate or the like may be referred to simply as insulating substrate hereinafter.

A conductor line is provided on the circuit substrate 4. The conductor line is, for example, a microstrip line having an impedance of 50 Ω. The impedance is, for example, the same as the impedance of the terminal 3a. An end portion of the microstrip line on the opposite side of the terminal 3a is connected to the electronic component 11 via a bonding wire 12. The end portion of the microstrip line on the terminal 3a side is joined to an upper end of the terminal 3a via the joint member 8. Accordingly, the terminal 3a and the electronic component 11 are electrically connected.

A grounding conductor (not illustrated) is formed on a lower surface or the like of the circuit substrate 4. The grounding potential (ground potential) is supplied from a grounding wiring conductor of the flexible substrate 6 to the grounding conductor via the housing 1 and the base 5. The grounding conductor is joined to the base 5 via the brazing material or the like, and is electrically connected to the grounding wiring conductor of the flexible substrate 6.

The following conditions may be set in order to achieve a characteristic impedance of 50 Ω for the conductor line of the circuit substrate 4 if the circuit substrate 4 is of the microstrip structure. In other words, a grounding conductor 5c may be formed on a lower surface of an insulating substrate formed of 96% aluminum oxide ceramics having a relative permittivity of 9.5 and having a thickness of 0.3 mm, and a conductor line on an upper surface thereof may have a width of 0.3 mm and a thickness of 4 μm. When the insulating substrate is formed of the same alumina ceramics and has a thickness of 0.5 mm, the conductor line may have a thickness of 4 μm, and a thickness of 0.5 mm.

When the circuit substrate 4 is formed, for example, of alumina ceramics, the circuit substrate 4 may be manufactured in the following method. First of all, a slurry obtained by admixing adequate organic binder, plasticizer, and solvent to raw material powder such as aluminum oxide, magnesium oxide, and calcium oxide is molded by a doctor blade method or a calender roll method to form a ceramic green sheet (ceramic raw sheet). Subsequently, the ceramic green sheet is subjected to adequate punching process to have a predetermined shape. A plurality of the processed ceramic green sheets are laminated as needed to form a laminated body. Subsequently, the laminated body is fired at a temperature of approximately 1600° C. With the processes described above, the circuit substrate 4 is manufactured. The insulating substrate obtained after the firing has a thickness of approximately 0.2 to 0.3 mm. In order to match the impedance of the conductor line to, for example, 50 Ω, the insulating substrate is manufactured to be thin.

The base 5 is provided with the insertion hole 5a. The terminal 3a is inserted into the insertion hole 5a to form an air coaxial structure. Accordingly, impedance mismatching can be hard to occur at a portion where the terminal 3a projects from the bottom surface of the concave portion 1b of the housing 1. Therefore, adequate transmission of the high-frequency signal is enabled.

The insertion hole 5a communicates, for example, with the through hole 2, and has a diameter of 0.23 to 1.15 mm. The diameter of the insertion hole 5a through which the terminal 3a passes is set to a dimension which allows formation of the air-coaxiality having a characteristic impedance of 50 Ω by the terminal 3a penetrating through the center. For example, in the case where the dimension of the terminal 3a is 0.2 mm, the diameter of the insertion hole 5a may be set to 0.46 mm.

The base 5 is joined to the bottom surface of the concave portion 1b of the housing 1 via a low melting point brazing material such as Au—Sn alloy. The circuit substrate 4 is placed on the upper surface of the base 5. The circuit substrate 4 is joined to the base 5 via the low melting point brazing material such as Au—Sn alloy.

The base 5 is formed of a metal having a coefficient of thermal expansion intermediate between a coefficient of thermal expansion of the housing 1 and a coefficient of thermal expansion of the circuit substrate 4, such as Fe—Ni alloy. The base 5 functions as a cushioning material for preventing the circuit substrate 4 to be placed on the upper surface from cracking by the action of a significant stress due to temperature changes. In other words, the base 5 functions as the base 5 for relay. When the circuit substrate 4 is directly placed on the housing 1 having a coefficient of thermal expansion matching the coefficient of thermal expansion of the LN element, a coefficient of thermal expansion of the body portion 1a is significantly different from a coefficient of thermal expansion of the circuit substrate 4. The circuit substrate 4 may be subjected to cracking due to the difference in coefficient of thermal expansion. In order to prevent such a problem, this embodiment has a configuration in which the base 5 is placed on the bottom surface of the concave portion 1b of the body portion 1a and the circuit substrate 4 is placed on the upper surface of the base 5.

For example, when the body portion 1a is formed of SUS304 (coefficient of thermal expansion: $17.3 \times 10^{-6}/°C$.) and the circuit substrate 4 is alumina ceramics (coefficient of thermal expansion: $6.5 \times 10^{-6}/°C$.), the base 5 is formed of, for example, a metallic material of Fe-50Ni alloy (coefficient of thermal expansion: $9.9 \times 10^{-6}/°C$.) having an intermediate coefficient of thermal expansion between the body portion 1a and the circuit substrate 4. In this case, a stress applied to the circuit substrate 4 is alleviated by the base 5. Therefore, a probability of cracking of the circuit substrate 4 is reduced. Note that the base 5 may be formed by applying a metal machining process such as rolling or punching on the ingot formed of a material of the base 5.

By forming the base 5 to have a thickness of 1 to 2 mm, it is possible to reduce a probability of occurrence of cracks or the like in the circuit substrate 4. When the thickness of the base 5 is 1 mm or more, a stress generated by the difference in the coefficient of thermal expansion between the body portion 1a and the circuit substrate 4 may be effectively alleviated. When the thickness of the base 5 is 2 mm or less, the height of the electronic device may be effectively reduced, so that a thinner device can be achieved. As the frequency to be transmitted becomes higher, the thickness of the circuit substrate 4 needs to be reduced and the conductor line (not illustrated) provided on the circuit substrate needs to be thinner in order to enhance the transmission characteristics. In this case, the thickness of the base 5 may be 1.7 to 2 mm for preventing easy cracking of the circuit substrate 4.

The conductor line and the grounding conductor (not illustrated) of the circuit substrate 4 is formed of a metallic material selected from metallic materials including tungsten, molybdenum, manganese, copper, silver, palladium, platinum and gold.

When the conductor line and the grounding conductor are formed, for example, of a tungsten, the conductor line and the grounding conductor are formed in the following manner. First of all, a metallic paste is prepared by adding and kneading an inorganic solvent and a binder into tungsten powder. Next, a ceramic green sheet which constitutes an insulating substrate is printed with the metallic paste into a predetermined wiring pattern by using a screen printing method. With a method including the above-described process, the conductor line and the grounding conductor can be formed.

The conductor line and the grounding conductor may also be manufactured by thin-film processing. When the conductor line and the grounding conductor are manufactured by the thin-film processing, the conductor line and the grounding conductor may be formed into a high-precision pattern. The conductor line and the grounding conductor formed by the thin-film processing is a conductive layer having three-layer structure including a closed-contact metal layer, a diffusion prevention layer and a main conductive layer laminated one after another.

When the conductor line and the grounding conductor are manufactured by the thin-film processing, these members are manufactured in the following manner, for example.

First of all, respective layers (three-layer structured conductive layer including the closed-contact metal layer, the diffusion prevention layer, and the main conductive layer laminated one after another), which become the conductor line and the grounding conductor, are formed by a thin-film forming method such as a deposition method, a sputtering method, and an ion plating method on an insulating substrate obtained after the firing. Subsequently, a resist film is formed, and the conductor line and the grounding conductor are formed by a thin-film processing such as photolithography processing and etching.

The side surface of the base 5 may entirely abut on a side wall of the concave portion 1b of the housing 1. In this case, the side surface of the base 5 and the inner surface of the housing 1 have no space therebetween and are in contact with each other. Therefore, no resonance occurs ever, and a probability of addition of a noise generated by resonance to a high-frequency signal being transmitted along the conductor line is reduced. Then, transmission of the high-frequency signal is satisfactorily enabled.

Although the side surface of the base 5 may abut on the side wall of the concave portion 1b as described above, the side surface of the base 5 is difficult to entirely abut on the side wall of the concave portion 1b unless an angle formed between the side wall of the concave portion 1b and the bottom surface is a right angle. In this case, a space is generated between the side surface of the base 5 and the side wall of the concave portion 1b. Then, resonance may occur in the space. The noise generated by resonance is added to the high-frequency signal in the conductor line, and thus satisfactory transmission of the high-frequency signal may become difficult.

In such a case, a notch or a chamfer may be formed at a lower corner of the base 5. By forming the chamfer, the side surface of the base 5 may easily abut on the side wall of the concave portion 1b. Consequently, a probability of generation of resonance between the side surface of the base 5 and the side wall of the concave portion 1b is reduced, and thus satisfactory transmission of the high-frequency signal is enabled.

When a space is generated between the side surface of the base 5 and the side wall of the concave portion 1b, it is advantageous in the following point if the width of the space is 50 μm or larger and 0.1 mm or smaller. In other words, the intensity of resonance is reduced in inverse proportion to square of the width of the space. Therefore, resonance is hard to occur when the width of the space, that is, the distance between the side surface of the base 5 and the side wall of the concave portion 1b is 50 μm or larger. The noise generated by resonance is reduced, and high-frequency signal may be satisfactorily transmitted along the conductor line. Therefore, when the width of the space is 50 μm or larger, satisfactory transmission of the high-frequency signal is achieved. The larger the width of the space is, the weaker the resonance becomes. Therefore, effectiveness increases with the width of the space in terms of electric characteristics. However, when considering downsizing of the electronic device, the width of the space is set to be 0.1 mm or smaller.

The lid body 13 is joined to an outer peripheral portion of an upper surface of the housing 1 by a soldering method or a seam welding method. The lid body 13 is configured to hermetically seal the electronic component 11 in the electronic component mounting packages 20, 20A, 20B. Examples of the material of the lid body 13 include a metallic material such as Fe—Ni—Co alloy, and ceramics such as alumina ceramics. The lid body 13 may be joined to the outer peripheral portion of the upper surface of the housing 1 via a low-melting point grazing material such as Au—Sn alloy or may be joined by welding such as seam welding. Accordingly, the electric component 11 is sealed within the electronic component mounting package 20, 20A, 20B.

The electronic component mounting package 20, 20A, 20B of this embodiment are connected at an upper end of the terminal 3a to the conductor line of the circuit substrate 4 with a brazing material. The terminal 3a is inserted air-concentrically into the center of the insertion holes 5a so as to achieve a high-frequency impedance of, for example, 50 Ω. In addition, the terminal 3a is fixed to the center of the through hole 2 of the body portion 1a so as to achieve a high-frequency impedance of 50 Ω. Then, the lower end of the terminal 3a is connected by the brazing material to the wiring conductor of the flexible substrate 6. Grounding wiring conductors of the flexible substrate 6 is disposed on both sides of the wiring conductor so as to interpose the wiring conductor therebetween. The respective grounding wiring conductors are connected to the lower surface of the body portion 1a with the brazing material. The wiring conductor and the grounding wiring conductor constitutes a coplaner line. The coplanar line is formed so that the impedance becomes 50 Ω even outside the housing 1.

The invention is not limited to the embodiments and examples described above, and various modifications are possible without departing the scope of the invention. For example, the LN element has been exemplified as the electronic component 11 in an embodiment described above. However, the invention is not limited to this, and the electronic component 11 may be a high-frequency semiconductor device or the like.

In the description of the above-described embodiments, terms "upper", "lower", "right", and "left" have been merely used for explaining the positional relationship on the drawing, and do not mean the positional relationship at the time of actual use.

REFERENCE SIGNS LIST

1: Housing
1a: Body portion
1b: Concave portion
1c: Notched portion
2: Through hole
3: Coaxial connector
3a: Terminal
3b: Retaining member
3c: Sealing member
4: Circuit substrate
5: Base
5a: Insertion hole
6: Flexible substrate
6a: Free end portion
6b: Fixed end portion
7: Projecting ridge portion
7a: Chamfered portion
8: Joint member
9: Groove
10: Chamfered portion
11: Electronic component
12: Bonding wire
13: Lid body
20: Electronic component mounting package
30: Electronic device

The invention claimed is:

1. An electronic component mounting package, comprising:
  a housing including
    a body portion comprising an upper surface disposed with an concave portion to accommodate an electronic component, a lower surface disposed with a notched portion, and a through hole extending from a bottom surface of the concave portion to a bottom surface of the notched portion, and
    a projecting ridge portion located on the bottom surface of the notched portion and extending along an end portion of a notched side surface of the body portion;
  a coaxial connector disposed in the notched portion, the coaxial connector including a terminal comprising an upper end projecting through the through hole into an interior of the concave portion and a lower end projecting into an interior of the notched portion; and
  a flexible substrate extending from the interior of the notched portion to an exterior of the notched portion, the flexible substrate including a fixed end portion joined to the lower end of the terminal and a free end portion on an opposite side to a fixed end portion side, the flexible substrate abutting on the projecting ridge portion to be bent.

2. The electronic component mounting package according to claim 1, wherein the through hole comprises an opening area on a bottom surface side of the notched portion larger than an opening area on a bottom surface side of the concave portion,
  the coaxial connector includes a retaining member comprising a hole through which the terminal is inserted, and the retaining member is accommodated in the through hole, and
  a groove extending along the projecting ridge portion is located in an area between the projecting ridge portion and the coaxial connector of the bottom surface of the notched portion, and the groove communicates with the through hole.

3. The electronic component mounting package according to claim 1, wherein the projecting ridge portion is a rectangular parallelepiped shape comprising a chamfered portion at an inner corner facing the coaxial connector, and the chamfered portion abuts on the flexible substrate.

4. An electronic device, comprising:
  the electronic component mounting package according to claim 1;

an electronic component accommodated in the concave portion of the electronic component mounting package, and a lid body joined to the electronic component mounting package and covering the electronic component.

\* \* \* \* \*